United States Patent
Jo et al.

(10) Patent No.: US 9,661,750 B2
(45) Date of Patent: May 23, 2017

(54) PRINTED CIRCUIT BOARD AND METHOD OF MANUFACTURING THE SAME

(71) Applicant: LG INNOTEK CO., LTD., Seoul (KR)

(72) Inventors: Yun Kyoung Jo, Seoul (KR); Seol Hee Lim, Seoul (KR); Chang Hwa Park, Seoul (KR); Sai Ran Eom, Seoul (KR); Ae Rim Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 341 days.

(21) Appl. No.: 14/364,013

(22) PCT Filed: Nov. 30, 2012

(86) PCT No.: PCT/KR2012/010290
§ 371 (c)(1),
(2) Date: Jun. 9, 2014

(87) PCT Pub. No.: WO2013/085229
PCT Pub. Date: Jun. 13, 2013

(65) Prior Publication Data
US 2015/0000966 A1 Jan. 1, 2015

(30) Foreign Application Priority Data
Dec. 8, 2011 (KR) .................. 10-2011-0131369

(51) Int. Cl.
*H05K 1/09* (2006.01)
*H05K 3/18* (2006.01)
*H05K 3/24* (2006.01)

(52) U.S. Cl.
CPC ............ *H05K 1/092* (2013.01); *H05K 3/182* (2013.01); *H05K 3/188* (2013.01); *H05K 3/244* (2013.01);
(Continued)

(58) Field of Classification Search
CPC ........ H05K 1/092; H05K 3/182; H05K 3/188; H05K 3/244
See application file for complete search history.

(56) References Cited

U.S. PATENT DOCUMENTS 6,127,052 A * 10/2000 Tomari .................. H05K 3/181
 205/126
2006/0144618 A1* 7/2006 Song ...................... H05K 3/423
 174/266

(Continued)

FOREIGN PATENT DOCUMENTS

JP H11-330652 A 11/1999
JP 2000-349186 A 12/2000
(Continued)

OTHER PUBLICATIONS

Office Action dated Apr. 29, 2015 in Taiwanese Application No. 101145470.
(Continued)

*Primary Examiner* — Timothy Thompson
*Assistant Examiner* — Amol Patel
(74) *Attorney, Agent, or Firm* — Saliwanchik, Lloyd & Eisenschenk (57) ABSTRACT

Provided is a printed circuit board, including: a circuit pattern or a base pattern formed on an insulating layer; and a plurality of metal layers formed on the circuit pattern or the base pattern, wherein the metal layers includes: a silver metal layer formed of a metal material including silver; a first palladium metal layer formed at a lower part of the silver metal layer; and a second palladium metal layer formed at an upper part of the silver metal layer.

18 Claims, 5 Drawing Sheets

(52) U.S. Cl.
CPC ............ *H05K 2201/0341* (2013.01); *H05K 2201/099* (2013.01); *H05K 2201/09436* (2013.01); *Y10T 29/49155* (2015.01)

(56) References Cited

U.S. PATENT DOCUMENTS

| | | | |
|---|---|---|---|
| 2010/0263443 A1* | 10/2010 | Mattmann | G01F 23/38 73/290 R |
| 2011/0139491 A1* | 6/2011 | Chang | C23C 18/1651 174/254 |

FOREIGN PATENT DOCUMENTS

| | | | |
|---|---|---|---|
| KR | 10-2006-0109365 A | 10/2006 | |
| KR | 10-2010-0073378 A | 7/2010 | |
| TW | 201044526 A | 12/2010 | |

OTHER PUBLICATIONS

International Search Report in International Application No. PCT/KR2012/010290, filed Nov. 30, 2012.

\* cited by examiner

| Item | Unit | Copper | Gold | Silver |
|---|---|---|---|---|
| Symbol | - | Cu | Au | Ag |
| Atomic Number | - | 29 | 79 | 47 |
| Atomic Weight | - | 63.546 | 196.967 | 107.88 |
| Crystalline Structure | - | fcc | fcc | fcc |
| Lattice Constant | Angstrom | 3.6147 | 4.0785 | 4.09 |
| Melting Point | ℃ | 1083.45 | 1063.15 | 961.9 |
| Boiling Point | ℃ | 2582 | 2710 | 2163 |
| Density | g/cm3 | 8.93 | 19.32 | 10.49 |
| Electrical Resistivity | mWcm | 1.69 | 2.3 | 1.59 |
| Thermal Conductivity | W/m·k | 394 | 293 | 429 |
| Coefficient of linear Expansion | 10^6/K | 16.6 | 14.2 | 18.9 |
| Tensile Strength | Mpa | 340 | 230 | 125 |
| Young Modulus | 10^10 N/m2 | 13.6 | 8.8 | 8.3 |
| Elongation | % | 15 | 4.5 | |

PRINTED CIRCUIT BOARD AND METHOD OF MANUFACTURING THE SAME

CROSS-REFERENCE TO RELATED APPLICATIONS

This application is the U.S. national stage application of International Patent Application No. PCT/KR2012/010290, filed Nov. 30, 2012, which claims priority to Korean Application No. 10-2011-0131369, filed Dec. 8, 2011, the disclosures of each of which are incorporated herein by reference in their entirety.

TECHNICAL FIELD

The present invention relates to a printed circuit board and a method of manufacturing the same.

This application claims priority to Korean Patent Application No. 10-2011-0131369, filed on Dec. 8, 2011, in the Korean Intellectual Property Office, the entire contents of which are hereby incorporated by reference.

BACKGROUND ART

As a cost of gold has recently increased, efforts to reduce an amount of gold included in electronic components have been made in the electronics industry. However, for the surface treatment of a printed circuit board and a wire connected to a semiconductor chip, gold is being mainly used. Accordingly, the electronic components industry has been making efforts to replace a gold wire with a copper wire, and researches on the bonding between a copper wire and a chip have been conducted by many companies in each country.

Figure 1:
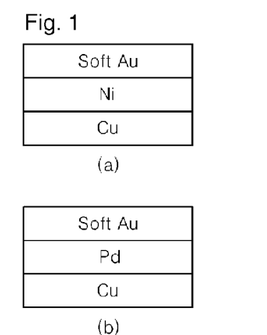
FIG. 1 is a view for explaining a structure for surface treatment of a printed circuit board according to a conventional art.

FIG. 1 is a view for explaining a surface treatment structure of a printed circuit board according to a conventional art.

Referring to FIG. 1, upon the conventional surface treatment of the printed circuit board, a nickel-gold plated layer or a nickel-palladium-gold plated layer is generally used. At this time, the plated layers are layers which are designed to be suitable for a gold wire. Thus, a soft gold plated layer is finally formed so as to be connected to the gold wire.

However, when copper wire bonding is applied to the plated layers having the above structure, the bonding between the copper wire and the plated layers is made, but due to the property of soft gold, it was problematic that a bonding yield of the hard copper wire is low, and a bonding ability is reduced.

A surface treatment structure including a silver plated layer which will be hereinafter applied also has the same problem as the above. That is, like gold, silver also has a soft property, so upon the bonding of the copper wire and the silver plated layer, the plated layer does not sufficiently support the copper wire, thereby lowering a bonding ability.

DISCLOSURE OF INVENTION

Technical Problem

An aspect of the present invention provides a printed circuit board and a method of manufacturing the same, which can improve the hardness of a metal layer by forming the metal layer using pure palladium or a palladium alloy. An aspect of the present invention also provides a printed circuit board and a method of manufacturing the same, which can reduce a cost for surface treatment by forming a metal layer using palladium having high hardness instead of gold.

An aspect of the present invention also provides a printed circuit board and a method of manufacturing the same, which can improve a wire bonding ability and a solder bonding ability by forming a palladium metal layer at an upper part and a lower part of a silver metal layer to prevent silver migration.

Solution to Problem

According to an aspect of the present invention, there is provided a printed circuit board, including: a circuit pattern or a base pad formed on an insulating layer; and a plurality of metal layers formed on the circuit pattern or the base pad, wherein the metal layers includes: a silver metal layer formed of a metal material including Ag; a first palladium metal layer formed at a lower part of the silver metal layer; and a second palladium metal layer formed at an upper part of the silver metal layer.

According to an aspect of the present invention, there is also provided a method of manufacturing a printed circuit board, including: preparing an insulating substrate on which a circuit pattern or a base pad is formed; forming a first palladium metal layer on the circuit pattern or the base pad using a palladium plating solution including palladium forming a silver metal layer on the first palladium metal layer using a silver plating solution including silver and forming a second palladium metal layer on the silver metal layer using the palladium plating solution including palladium.

Advantageous Effects of Invention

According to one exemplary embodiment of the present invention, since surface treatment is performed without the use of gold, a cost for the surface treatment can be reduced. Furthermore, since a surface treatment structure capable of increasing the bonding ability at copper wire bonding is provided, a cost incurred at an assembling step can be largely reduced.

According to another exemplary embodiment of the present invention, since the layer for controlling a metal migration phenomenon generated from silver is induced, reliability of the printed circuit board concerning corrosion can be secured.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

BEST MODE FOR CARRYING OUT THE INVENTION

Hereinafter, preferred embodiments of the present invention will be described in detail with reference to the accompanying drawings. Also, regardless reference numerals of drawing, like numbers may refer to like elements throughout the description of the figures. The repeated explanation thereon is omitted.

When it is mentioned that a part such as a layer, a film, an area, a plate and the like is "above" other part, this includes a case in which the part is just above the other part as well as a case in which still another part is in their middle. On the contrary, when it is mentioned that a part is just above other part, this means that there is no still another part in their middle.

In the present invention as a surface treatment method of an insulating substrate, there is provided a surface treatment method of a printed circuit board, which can prevent silver migration from being generated at a silver metal layer at the same time as improving a wire bonding ability by forming the silver metal layer and forming a palladium plated layer at an upper part and a lower part of the silver metal layer.

Hereinafter, a printed circuit board according to a first exemplary embodiment will be explained with reference to FIG. 2 through FIG. 9.

Figure 2:
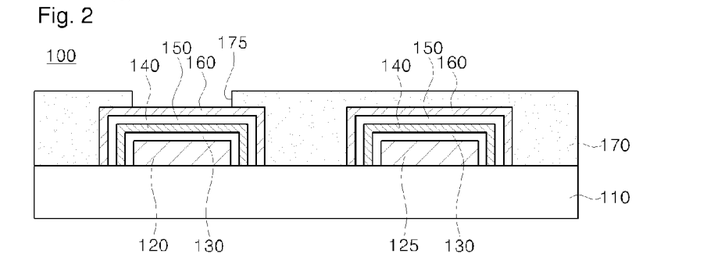
FIG. 2 is a cross-sectional view of a printed circuit board according to a first exemplary embodiment of the present invention.

FIG. 2 is a cross-sectional view of a printed circuit board according to a first exemplary embodiment of the present invention.

Referring to FIG. 2, a printed circuit board 100 according to a first exemplary embodiment of the present invention includes: an insulating plate 110; a base pad 120 which is connected to a circuit pattern 125 formed on the insulating plate 110; and a protective layer 170 which covers the circuit pattern 125. Furthermore, a nickel metal layer 130, a first palladium metal layer 140, a silver metal layer 150 and a second palladium metal layer 160 are sequentially formed on the base pad 120 and the circuit pattern 125.

The insulating plate 110 may be a support substrate of the printed circuit board on which a single circuit pattern is formed. However, the insulating plate may mean an insulating area in which one circuit pattern (not drawn) of the printed circuit board having a plurality of laminated structures is formed.

When the insulating plate 110 means one insulating layer of the plurality of laminated structures, a plurality of circuit patterns (not drawn) may be sequentially formed at an upper part or a lower part of the insulating plate 110.

The insulating plate 110 may be a thermosetting or thermoplastic polymer substrate, a ceramic substrate, a substrate of an organic-inorganic composite material, or a glass fiber-impregnated substrate. When the insulating plate 110 includes a polymer resin, it may include an epoxy-based insulating resin. To be different from this, a polyimide-based resin may be also included therein.

The plurality of base pads 120 connected to the plurality of circuit patterns 125 are formed on the insulating plate 110. The base pad 120 is a bump for mounting a device mounted on the printed circuit board 100 and mean the base pad 120 to which a solder (not drawn) is bonded or a wire is bonded.

The circuit pattern 125 and the base pad 120 may be formed of a conductive material and may be formed by simultaneously patterning a copper foil laminate formed on the insulating plate 10 with them. Accordingly, the circuit pattern 125 and the base pad 120 may be formed of an alloy including Cu, and roughness may be increased on each surface thereof.

The nickel metal layer 130 is formed on an upper surface and a side of the circuit patterns 125 and the base pads 120.

The nickel metal layer 130 is formed using a nickel plating solution including Ni, and roughness is increased on a surface thereof.

The nickel metal layer 130 may be formed of only nickel, or may be formed of an alloy of P (phosphorus), B (boron), W (tungsten), or Co (cobalt), including Ni (nickel), and may have a thickness of 0.1 to 15 μm.

The nickel metal layer 130 is formed to satisfy a hardness of 100 to 400 Hv. That is, the nickel metal layer 130 is formed to satisfy the above hardness condition so that a hardness property which is applicable to bond the copper wire to the silver metal layer 150 which will be produced later can be secured The first palladium metal layer 140 is formed on the nickel metal layer 130 to surround an upper surface and a side of the nickel metal layer 130.

The first palladium metal layer 140 may be formed using a palladium plating solution including Pd, and roughness may be increased on its surface.

The first palladium metal layer 140 may be formed of only pure palladium. To be different from this, the first palladium metal layer 140 may be formed of a palladium alloy including at least one other metal. At this time, when the first palladium metal layer 140 is formed of the palladium alloy, the palladium alloy may include palladium and nickel. Also, the nickel in the palladium alloy may be included in a range of 0.1 to 20 wt %.

That is, since the first palladium metal layer 140 is intended to secure the hardness of a certain level or more, the first palladium metal layer 140 may be formed of an alloy of Pd and Ni. At this time, the first palladium metal layer 140 may be formed in a thickness ranging from 0.01 to 0.1 μm.

The silver metal layer 150 is formed on the first palladium metal layer 140 to surround an upper surface and aside of the first palladium metal layer 140.

The silver metal layer 150 is formed for the bonding with a copper wire later, and secures a hardness property of a certain level or more for the bonding with the copper wire. The hardness property of the silver metal layer 150 is determined by the nickel metal layer 130, which is an underlayer. The hardness of the nickel metal layer 130 should be secured in a certain level or more so that the silver metal layer 150 may secure the hardness of a certain level or more.

Also, the silver metal layer 150 is formed to replace the gold metal layer provided in the conventional art.

Figure 22:
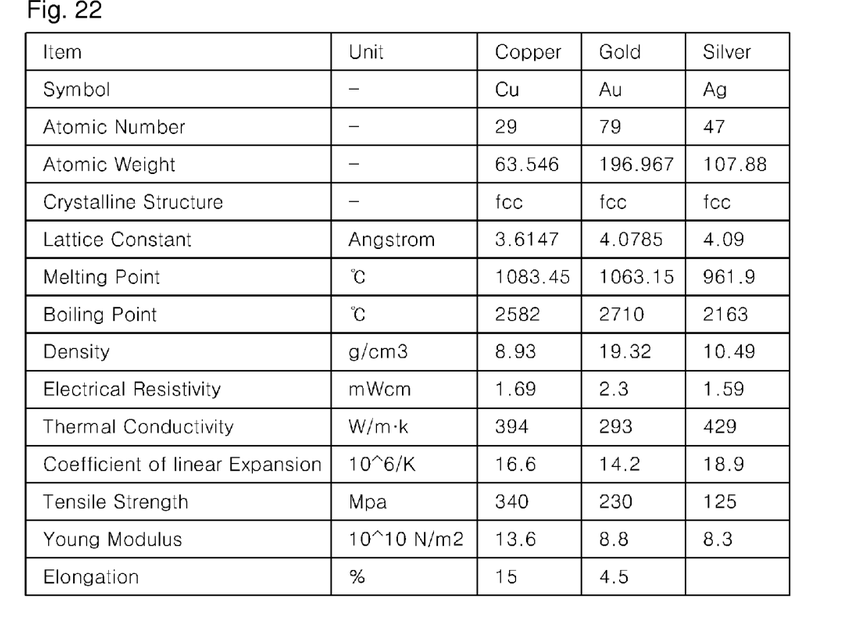
FIG. 22 is a table showing physical properties of Cu, Ag, and Au.

FIG. 22 is a table showing physical properties of Cu, Ag, and Au.

Referring to FIG. 22, the property of silver is similar to that of gold. Silver may be used instead of gold. When the silver instead of the gold is used, a cost for surface treatment can be reduced as the gold having a high cost is not used.

Also, the silver metal layer 150 may be formed of pure silver, or may be also formed of a silver alloy including gold. When the silver metal layer 150 is formed of the silver alloy, the silver alloy may be desirable to include gold. The gold in the silver alloy may be included in a range of 0.1 to 50%.

The silver metal layer 150 is formed in a thickness ranging from 0.1 to 5 μm.

The second palladium metal layer 160 is formed on the silver metal layer 150 to surround the upper surface and the side of the silver metal layer 150.

The second palladium metal layer 160 is formed to prevent silver migration of the silver metal layer 150 which is the underlayer.

The second palladium metal layer 160 may be formed of a palladium alloy including pure palladium or at least one metal of cobalt, zinc, nickel and an inorganic substance and may be formed in a thickness ranging from 0.01 to 0.1 μm.

According to the present exemplary embodiment of the invention, one metal circuit pattern may be formed in a laminated structure including: the circuit pattern 125; the nickel metal layer 130 on the circuit pattern 125 the first palladium metal layer 140; the silver metal layer 150 and the second palladium metal layer 160. Furthermore, one pad may be formed in a laminated structure, including: the base pad 120; the nickel metal layer 130 on the base pad 120 the first palladium metal layer 140; the silver metal layer 150; and the second palladium metal layer 160.

The protective layer 170 is formed on the insulating plate 110 to cover the circuit pattern 125.

The protective layer 170 protects a surface of the insulating plate 110 using a solder resist, and has an opening 175 for opening an upper surface of the laminated structure of the base pad 120 which is formed all over the surface of the insulating plate 110 so as to be exposed, namely, the second palladium metal layer 160.

A solder is formed or a wire is connected onto the second palladium metal layer 160 of the base pad 120 which is exposed. The wire may use both a copper wire and a gold wire.

Also, the nickel metal layer 130, the first palladium metal layer 140, the silver metal layer 150 and the second palladium metal layer 160 may be formed by an electrolytic plating method, or may be also formed by an electroless plating method.

Hereinafter, a method of manufacturing the printed circuit board 100 of FIG. 2 will be explained with reference to FIG. 3 through FIG. 9.

FIG. 3 through FIG. 9 are cross-sectional views showing a method manufacturing the printed circuit board 100 of FIG. 2.

Figure 3:
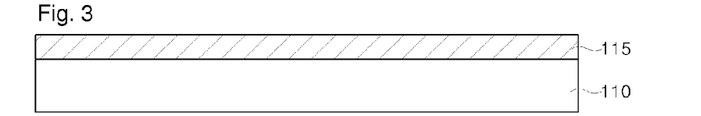
FIG. 3 through FIG. 9 are cross-sectional views showing a method of manufacturing the printed circuit board of FIG. 2.

First, as shown in FIG. 3, a conductive layer 115 is laminated on the insulating plate 110. When the insulating plate 110 is an insulating layer, the laminated structure of the insulating layer and the conductive layer 115 may be a normal copper clad laminate (CCL).

Figure 4:
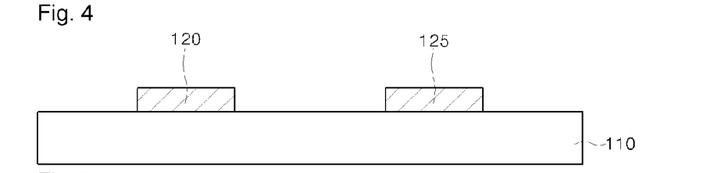

The base pad 120 and the circuit pattern 125 of FIG. 4 are formed by selectively removing the conductive layer 115 from the laminated structure of the conductive layer 115 and the insulating plate 110.

Figure 5:
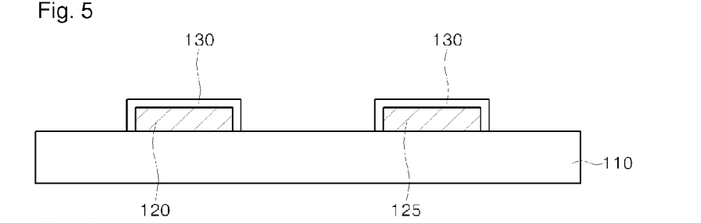

Next, the nickel metal layer 130 of FIG. 5 is formed by electrolytic plating the base pad 120 and the circuit pattern 125, which are patterned, as the seed layer.

The nickel metal layer 130 may be formed of only nickel, or may be formed of an alloy of P (phosphorus), B (boron), W (tungsten) or Co (cobalt), including Ni (nickel) and may have a thickness of 0.1 to 15 μm.

The nickel metal layer 130 is formed to satisfy a hardness of 100 to 400 Hv. That is, the nickel metal layer 130 is formed to satisfy the above hardness condition so that a hardness property which is applicable to bond the copper wire to the silver metal layer 150 which will be produced later can be secured.

At this time, roughness may be increased on the circuit pattern 125 and the base pad 120 so that the plating can be smoothly performed. The increasing of the roughness may be performed by roughly plating the circuit pattern 125 and the base pad 120 as the seed layer with Cu.

The nickel metal layer 130 is plated with the upper surface and the side of the circuit pattern 125 and the base pad 120 by electrolytic plating the circuit pattern 125 and the base pad 120 as the seed layer.

Figure 6:
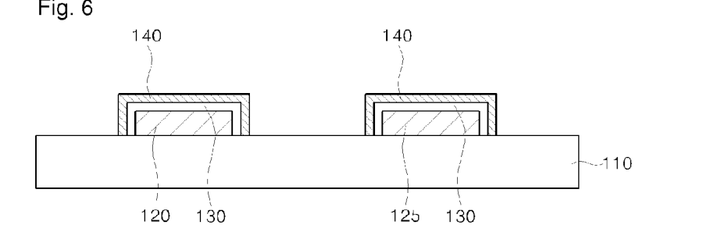

Next, as shown in FIG. 6, the first palladium metal layer 140 is formed by electrolytic plating the nickel metal layer 130 as the seed layer.

The first palladium metal layer 140 may be formed using a palladium solution including Pd, and roughness may be increased on its surface.

The first palladium metal layer 140 may be formed of only pure palladium, or may be formed of a palladium alloy including at least other one metal. At this time, when the first palladium metal layer 140 is formed of the palladium alloy, the palladium alloy may include palladium and nickel. Also, the nickel in the palladium alloy may be included in a range of 0.1 to 20%.

That is, since the first palladium metal layer 140 is intended to secure the hardness of a certain level or more, the first palladium metal layer 140 may be formed of an alloy of Pd and Ni. At this time, the first palladium metal layer 140 may be formed in a thickness ranging from 0.01 to 0.1 μm.

Figure 7:
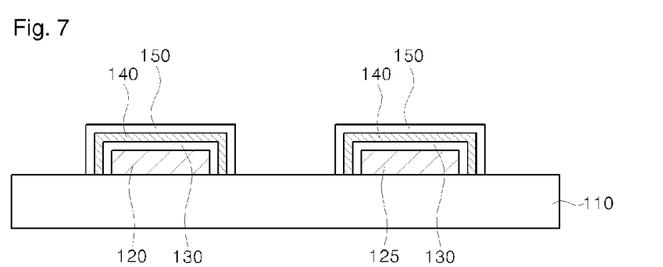

Next, as shown in FIG. 7, the silver plated layer 150 is formed by electrolytic plating the first palladium metal layer as the seed layer.

At this time, by adjusting a plating voltage, a grain size of the surface of the first palladium metal layer 140 may be largely formed, so roughness may be increased on the surface.

The silver metal layer 150 is formed to be bonded to the copper wire later, and secures the hardness property of a certain level or more for the bonding with the copper wire. The hardness property of the silver metal layer 150 is determined by the nickel metal layer 130 which is an underlayer. The hardness of the nickel metal layer 130 should be secured in a certain level or more so that the silver metal layer 150 can secure the hardness of a certain level or more.

Also, the silver metal layer 150 is used to replace the gold metal layer provided in the conventional art. That is, as illustrated in FIG. 22, the property of silver is similar to that of gold. The silver may be used instead of gold. When the silver instead of gold is used, a cost for surface treatment can be reduced as the gold having a high cost is not used.

Also, the silver metal layer 150 may be formed of pure silver, or may be also formed of a silver alloy including gold. When the silver metal layer 150 is formed of the silver alloy, the silver alloy may include gold. The gold in the silver alloy may be included in a range of 0.1 to 50%.

The silver metal layer 150 is formed in a thickness ranging from 0.1 to 5 μm.

Figure 8:
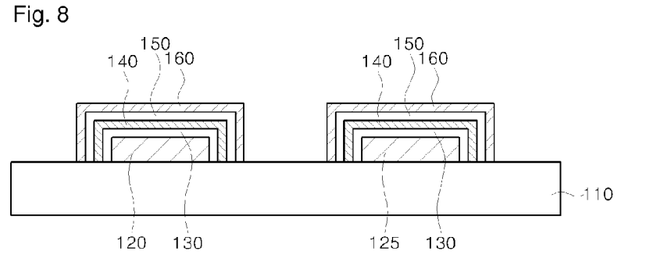

Next, as shown in FIG. 8, the second palladium metal layer is formed by electrolytic plating the silver metal layer 150 as the seed layer.

At this time, a grain size of the surface of the silver metal layer 150 may be largely formed by adjusting a plating voltage, so roughness may be increased onto the surface.

The second palladium metal layer 160 is formed to prevent silver migration of the silver metal layer 150 which is the underlayer.

The second palladium metal layer 160 may be formed of a palladium alloy including pure palladium or at least one metal of cobalt, zinc, nickel and an inorganic substance and may be formed in a thickness ranging from 0.01 to 0.1 μm.

According to the present exemplary embodiment of the invention, one metal circuit pattern is formed in a laminated structure including: the circuit pattern 125; the nickel metal layer 130 on the circuit pattern; the first palladium metal layer 140; the silver metal layer 150 and the second palladium metal layer 160. Furthermore, one pad is formed in a laminated structure, including: the base pad 120; the nickel metal layer 130 on the base pad; the first palladium metal layer 140; the silver metal layer 150; and the second palladium metal layer 160.

Figure 9:
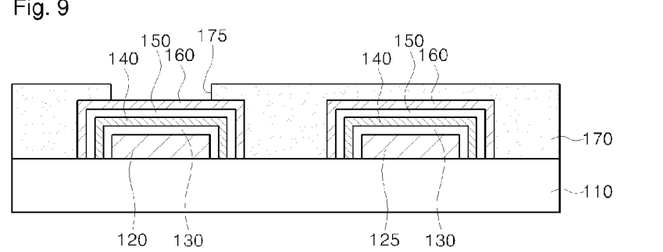

Next, the protective layer 170 is formed on the insulating plate 110 to bury the circuit pattern 125.

The protective layer 170 protects the surface of the insulating plate using a solder resist, and has the opening 175 for opening the upper surface of the laminated structure of the base pad 120 which is formed all over the surface of the insulating plate 110 so as to be exposed, namely, the second palladium metal layer 160.

A solder is formed on or a wire is bonded to the second palladium metal layer 160 of the base pad 120 which is exposed. The wire may use both a copper wire and a gold wire.

Hereinafter, the printed circuit board according to a second exemplary embodiment of the present invention with reference to FIG. 10 through FIG. 19.

Figure 10:
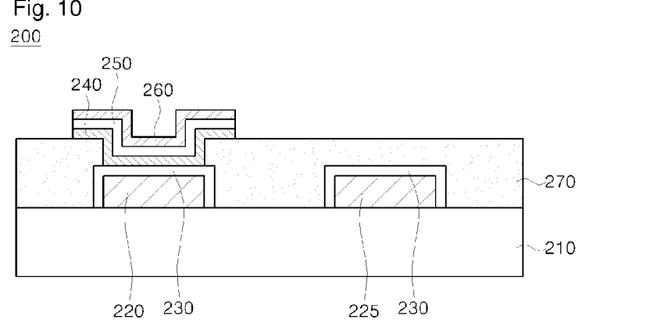
FIG. 10 is a cross-sectional view of a printed circuit board according to a second exemplary embodiment of the present invention.

FIG. 10 is a cross-sectional view of a printed circuit board according to a second exemplary embodiment of the present invention.

Referring to FIG. 10, a printed circuit board 200 according to the second exemplary embodiment of the present invention includes: an insulating plate 210; a base pad 220 which is connected to a circuit pattern 225 formed on the insulating plate 210; and a protective layer 270 which covers the circuit pattern 125.

Furthermore, a nickel metal layer 230, a first palladium metal layer 240, a silver metal layer 250 and a second palladium metal layer 260 are sequentially formed on the base pad 220 and the circuit pattern 225.

The insulating plate 210 may be a thermosetting or thermoplastic polymer substrate, a ceramic substrate, a substrate of an organic-inorganic composite material, or a glass fiber-impregnated substrate. When the insulating plate 210 includes a polymer resin, an epoxy-based insulating resin may be included therein. Unlike this, a polyimide-based resin may be also included therein.

The plurality of base pads 220 connected to the plurality of circuit patterns 225 are formed on the insulating plate 210. The base pad 220 is a bump for mounting a device mounted on the printed circuit board 200 and means the base pad 220 to which a solder (not drawn) is attached or a wire is bonded.

The circuit pattern 225 and the base pad 220 may be formed of a conductive material and may be formed by simultaneously patterning a copper foil laminate formed on the insulating plate 210 with them. Furthermore, the circuit pattern 125 and the base pad 120 may be formed of an alloy including Cu, and roughness may be increased on their surfaces.

The nickel metal layer 230 is formed on the circuit pattern 225 and the base pad 220.

The nickel metal layer 230 is formed using a nickel plating solution including Ni, and roughness is increased on its surface.

The nickel metal layer 230 may be formed of only nickel, or may be formed of an alloy of P (phosphorus), B (boron), W (tungsten) or Co (cobalt), including Ni (nickel). The nickel metal layer 230 has a thickness of 0.1 to 15 μm.

The nickel metal layer 230 is formed to satisfy a hardness of 100 to 400 Hv. That is, the nickel metal layer 230 is formed to satisfy the above hardness condition so that a hardness property which is applicable to bond the copper wire to the silver metal layer 250 which will be formed later can be secured.

The protective layer 270 is formed on the insulating plate 210 to expose one part of the nickel metal layer 230.

The protective layer 270 is formed all over the surface of the insulating plate 210 to protect the surface of the insulating plate 210 and has an opening 275 for opening the nickel metal layer 230 and an upper surface of the laminated structure of the base pad which should be exposed.

The first palladium metal layer 240 is formed on the nickel metal layer 230 of the base pad 220 which is exposed.

The first palladium metal layer 240 may be formed using a palladium plating solution including palladium, and roughness may be increased on its surface.

The first palladium metal layer 240 may be formed of only palladium. To be different from this, the first palladium metal layer 240 may be formed of a palladium alloy including at least one other metal. At this time, when the first palladium metal layer 240 is formed of the palladium alloy, the palladium alloy may include palladium and nickel. Also, the nickel in the palladium alloy may be included in a range of 0.1 to 20 wt %.

That is, since the first palladium metal layer 240 is intended to secure the hardness of a certain level or more, the first palladium metal layer 240 may be formed of an alloy of palladium and nickel. At this time, the first palladium metal layer 240 may be formed in a thickness ranging from 0.01 to 0.1 μm.

The silver metal layer 250 is formed on the first palladium metal layer 240.

The silver metal layer 250 is formed to be bonded to the copper wire later, and secures the hardness property of a certain level or more for the bonding with the copper wire. The hardness property of the silver metal layer 250 is determined by the nickel metal layer 230, which is the underlayer. The hardness of the nickel metal layer 230 should be secured in a certain level or more so that the silver metal layer 150 may secure the hardness of a certain level or more.

Also, the silver metal layer 250 is formed to replace the gold metal layer provided in the conventional art.

Also, the silver metal layer 250 may be formed of pure silver, or may be also formed of a silver alloy including gold. When the silver metal layer 250 is formed of the silver alloy, the silver alloy may include gold. The gold in the silver alloy may be included in a range of 0.1 to 50%.

The silver metal layer 250 is formed in a thickness ranging from 0.1 to 5 μm.

The second palladium metal layer 260 is formed on the silver metal layer 250.

The second palladium metal layer 260 is formed to prevent silver migration of the silver metal layer 250 which is the underlayer.

The second palladium metal layer 260 may be formed of a palladium alloy including pure palladium or at least one metal of cobalt, zinc, nickel and an inorganic substance and may be formed in a thickness ranging from 0.01 to 0.1 µm.

Unlike this, the printed circuit board 100 of FIG. 2, the printed circuit board 200 of FIG. 10 has a structure in which the first palladium metal layer 240, the silver metal layer 250, and the second palladium metal layer 260 are formed in only a pad structure 270 and are formed to extend up to the side of the opening 275 of the protective layer 270.

Also, unlike this, the nickel metal layer 230, the first palladium metal layer 240, the silver metal layer 250, and the second palladium metal layer 260 are formed in only the base pad 220. Thus, the nickel metal layer 230, the first palladium metal layer 240, the silver metal layer 250, and the second palladium metal layer 260 may be formed to extend up to the side of the opening FIG. 11 through FIG. 19 are cross-sectional views showing a method manufacturing the printed circuit board 100 of FIG. 10.

Figure 11:
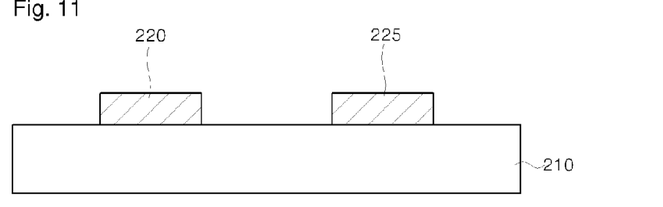
FIG. 11 through FIG. 19 are cross-sectional views showing a method of manufacturing the printed circuit board of FIG. 10.

First, as shown in FIG. 11, the conductive layer is laminated on the insulating plate 210. When the insulating plate 210 is an insulating layer, the laminated structure of the insulating layer and the conductive layer may be a normal copper clad laminate (CCL).

The base pad 220 and the circuit pattern 225 of FIG. 11 are formed by etching the conductive layer of the laminated structure of the conductive layer and the insulating plate 210.

Figure 12:
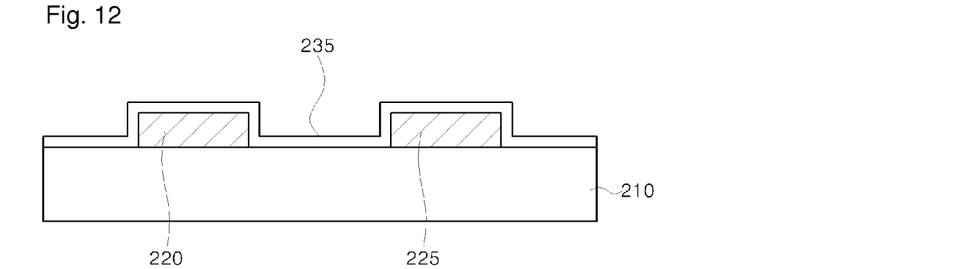

Next, the nickel plated layer 230 is formed by performing electroless plating on the base pad 220 and the circuit pattern 225 which are patterned.

At this time, the nickel plated layer 235 may be formed of only nickel, or may be formed of an alloy of P (phosphorus), B (boron), W (tungsten) or Co (cobalt), including Ni (nickel). The nickel plated layer 235 has a thickness of 0.1 to 15 µm.

The nickel plated layer 235 is formed to satisfy a hardness of 100 to 400 Hv. That is, the nickel plated layer 235 is formed to satisfy the above hardness condition so that a hardness property which is applicable to bond the copper wire to the silver metal layer 250 which will be produced later can be secured.

Figure 13:
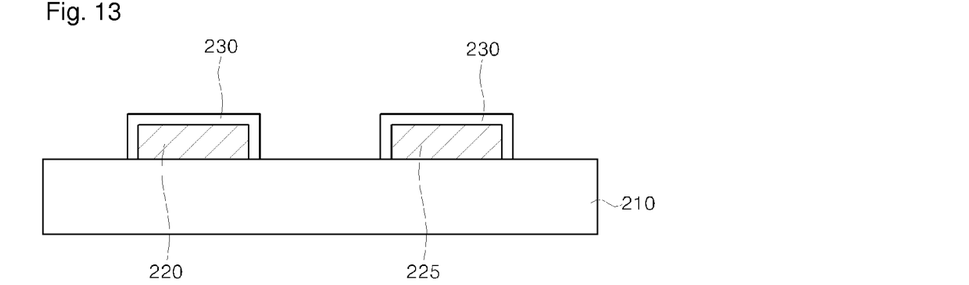

At this time, roughness may be increased on the circuit pattern 125 and the base pad 120 so that the plating is smoothly performed. Next, as shown in FIG. 13, the nickel metal layer 230 is formed by etching the nick plated layer 235.

At this time, the nickel metal layer 230 may be etched to have a larger width than the width of the circuit pattern 225 and the base pad 220 so as to surround the side of the base pad 220 and the circuit pattern 225.

Figure 14:
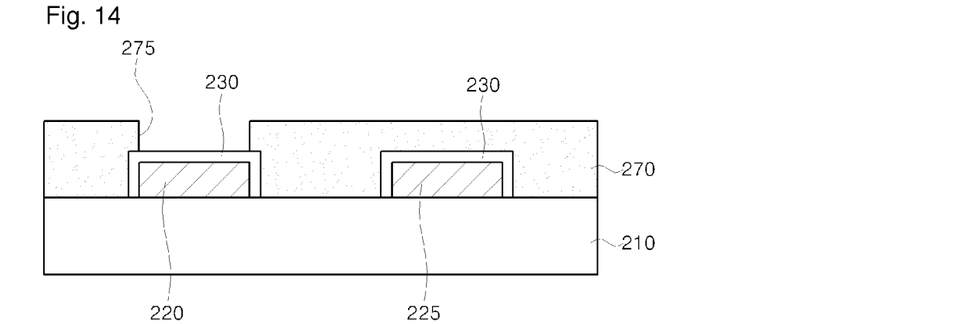

Next, as shown in FIG. 14, the protective layer 270 is coated to have the opening 275 for opening the nickel metal layer 230 on the base pad 220 while burying the circuit pattern 225.

Figure 15:
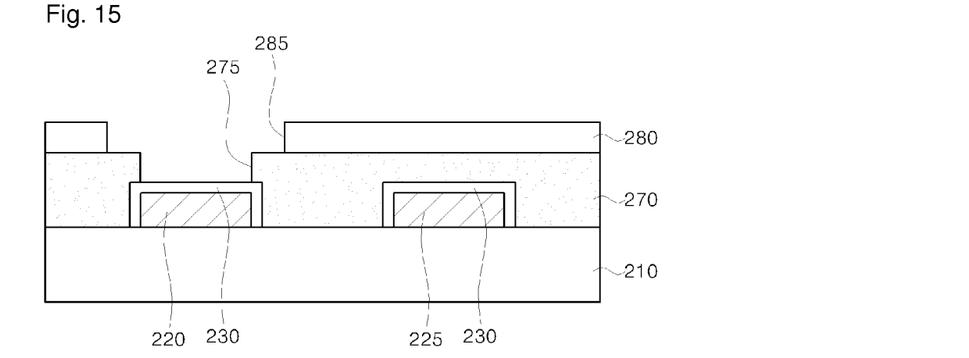

Next, as shown in FIG. 15, a mark 280 is formed on the protective layer 270.

The mask 280 may include a window 285 for opening the opening 275 of the protective layer 270 and may be formed of a photo resist or a dry film.

At this time, a width of the window 285 may be larger than that of the opening 275 of the protective layer 270.

Figure 16:
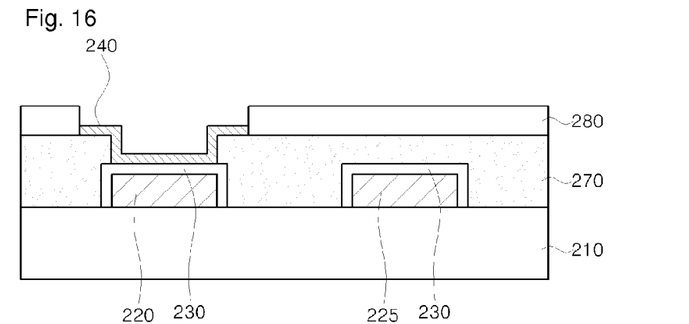

Next, the first palladium metal layer 240 is formed by plating the nickel metal layer 230 which is exposed to the window 275 as shown in FIG. 16.

The first palladium metal layer 240 may be formed using a palladium solution including palladium, and roughness may be increased on its surface.

The first palladium metal layer 240 may be formed of only pure palladium, or may be formed of a palladium alloy including at least one other metal. At this time, when the first palladium metal layer 240 is formed of the palladium alloy, the palladium alloy may include palladium and nickel. Also, the nickel in the palladium alloy may be included in a range of 0.1 to 20%.

That is, since the first palladium metal layer 240 is intended to secure the hardness of a certain level or more, the first palladium metal layer 240 may be formed of an alloy of palladium and nickel. At this time, the first palladium metal layer 240 may be formed in a thickness ranging from 0.01 to 0.1 µm.

At this time, a desmear process may be performed so that roughness is increased onto the side and a part of the upper surface of the protective layer 270 and the opening 275 before the first palladium metal layer 240 is formed.

Figure 17:
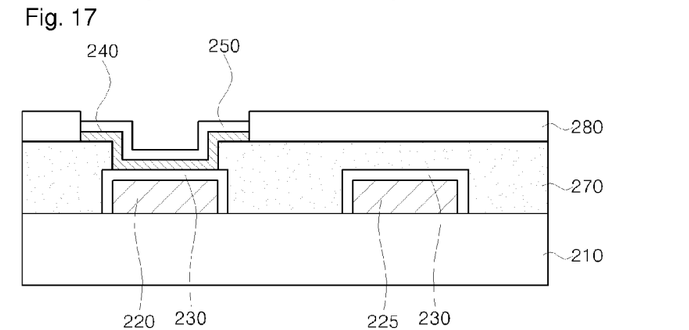

Next, as shown in FIG. 17, the silver plated layer 250 is formed by plating the first palladium metal layer which is exposed to the window 285.

The silver metal layer 250 is formed to be bonded to the copper wire later, and secures the hardness property of a certain level or more for the bonding with the copper wire. The hardness property of the silver metal layer 250 is determined by the nickel metal layer 230 which is an underlayer. The hardness of the nickel metal layer 230 should be secured in a certain level or more so that the silver metal layer 250 can secure the hardness of a certain level or more.

Also, the silver metal layer 250 is used to replace the gold metal layer provided in the conventional art. That is, as illustrated in FIG. 22, the property of silver is similar to that of gold. The silver may be used instead of gold. When the silver instead of the gold is used, the cost for surface treatment can be reduced as the gold having a high cost is not used.

Also, the silver metal layer 250 may be formed of pure silver, or may be also formed of an Silver alloy including Au. When the silver metal layer 250 is formed of the silver alloy, the silver alloy may include gold. The gold in the silver alloy may be included in a range of 0.1 to 50%.

The silver metal layer 250 is formed in a thickness ranging from 0.1 to 5 µm.

Figure 18:
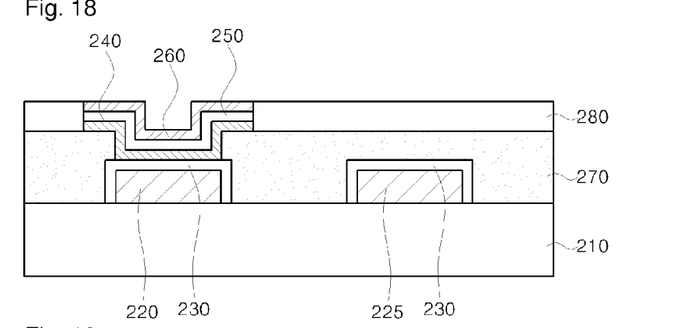

Next, as shown in FIG. 18, the second palladium metal layer 260 is formed by plating the silver metal layer 250 which is exposed to the window 285.

The second palladium metal layer 260 may be formed of a palladium alloy including pure palladium or at least one metal of cobalt, zinc, nickel and an inorganic substance and may be formed in a thickness ranging from 0.01 to 0.1 µm.

Figure 19:
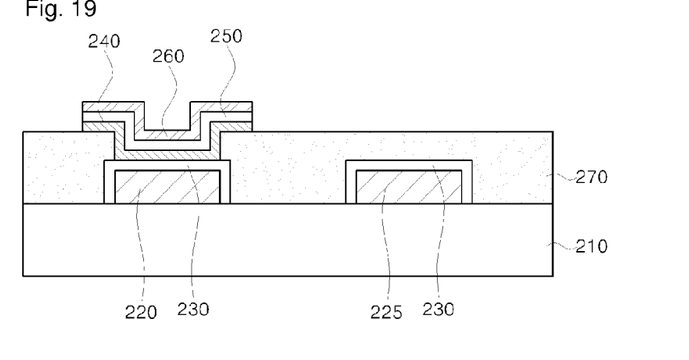

Lastly, the printed circuit board 200 may be completed by removing the mask 280 as shown in FIG. 19.

Figure 20:
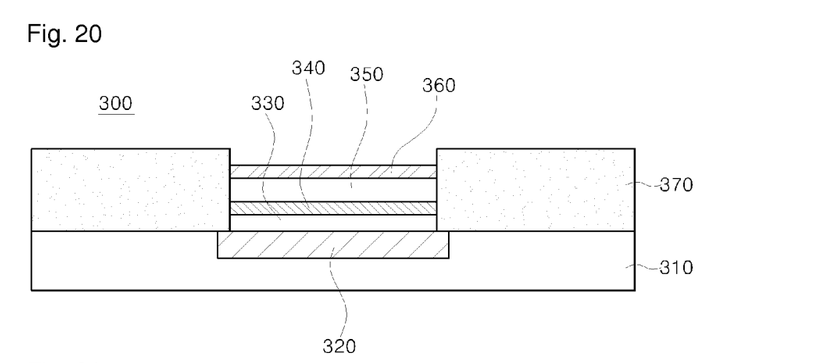
FIG. 20 is a cross-sectional view of a printed circuit board according to a third exemplary embodiment of the present invention.

FIG. 20 is a cross-sectional view of a printed circuit board according to a third exemplary embodiment of the present invention.

Referring to FIG. 20, a printed circuit board 300 according to the third exemplary embodiment of the present invention includes: an insulating plate 310; a base pad 320 which is buried in an inner part of the insulating plate; and a protective layer 370 which covers the insulating plate 310. Furthermore, a nickel metal layer 330, a first palladium metal layer 340, a silver metal layer 350 and a second palladium metal layer 360 are sequentially formed on the base pad 320.

The printed circuit board 300 according to the third exemplary embodiment of the present invention has a similar structure to the printed circuit boards according to the first exemplary embodiment and the second exemplary embodiment. However, the structure in which the base pad 320 is buried in the inner part of the insulating plate 310 is different from them.

Also, the nickel metal layer 330, the first palladium metal layer 340 and the silver metal layer 350 and the second palladium metal layer 360 are formed on only the upper surface of the base pad 320 exposed through the opening 375.

Figure 21:
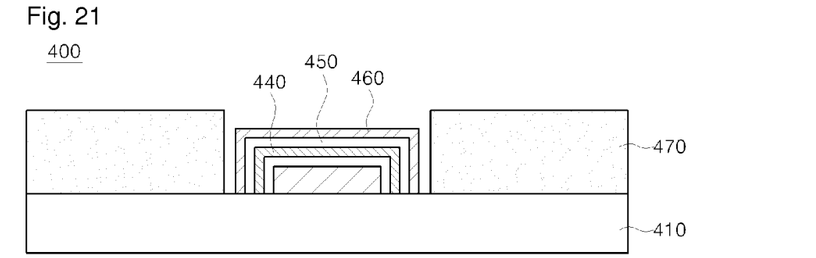
FIG. 21 is a cross-sectional view of a printed circuit board according to a fourth exemplary embodiment of the present invention.

Referring to FIG. 21, a printed circuit board 400 according to a fourth exemplary embodiment includes: an insulating plate 410; a base pad which 420 is buried in an inner part of the insulating plate 410; and a protective layer 470 which covers the insulating plate 410. Furthermore, a nickel metal layer 430, a first palladium metal layer 440, a silver metal layer 450 and a second palladium metal layer 460 are sequentially formed on the base pad 420.

The printed circuit board 400 according to the fourth exemplary embodiment has a similar structure to the printed circuit board 100 according to the first exemplary embodiment, and only with respect to the structure of the protective layer 470, they are different from each other.

That is, the protective layer 170 included in the printed circuit board 100 according to the first exemplary embodiment is formed to bury a part of the upper surface of the base pad 120. However, the protective layer 470 included in the printed circuit board 400 according to the fourth exemplary embodiment is formed to expose the whole upper surface of the base pad 420.

According to the present exemplary embodiment, since the surface treatment is conducted not using gold, the cost for the surface treatment can be reduced. Furthermore, since the surface treatment structure capable of improving a bonding ability at the bonding with the copper wire is provided, the cost incurred at assembling steps can be largely reduced.

Also, according to the present exemplary embodiment, since the layer for controlling the metal migration phenomenon generated in silver is induced, reliability of the printed circuit board according to corrosion can be secured.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A printed circuit board, comprising:
a circuit pattern or a base pattern disposed on an insulating layer;
a nickel metal layer disposed on the circuit pattern or the base pattern and formed of a metal including nickel;
a first palladium metal layer disposed on the nickel metal layer and formed of a metal including palladium;
a silver metal layer disposed on the first palladium metal layer and formed of a metal including silver; and
a second palladium metal layer disposed on the silver metal layer and formed of a metal including palladium.

2. The printed circuit board of claim 1, wherein the nickel metal layer is formed so as to satisfy a hardness of 100 to 400 Hv.

3. The printed circuit board of claim 1, wherein the nickel metal layer is formed in a thickness of 0.1 to 15 μm, the first palladium metal layer is formed in a thickness of 0.01 to 0.1 μm, the silver metal layer is formed in a thickness of 0.1 to 5 μm, and the second palladium metal layer is formed in a thickness of 0.01 to 0.1 μm.

4. The printed circuit board of claim 1, wherein roughness is increased on at least one surface of the circuit pattern or the base pad, the nickel metal layer, the first palladium metal layer, the silver metal layer, and the second palladium metal layer.

5. The printed circuit board of claim 1, wherein the whole metal layers composed of the nickel metal layer, the first palladium metal layer, the silver metal layer, and the second palladium metal layer are formed to satisfy a hardness of 80 to 500 Hv.

6. The printed circuit board of claim 1, wherein the palladium metal layer is formed of a palladium alloy including pure palladium or a nickel of 15 to 25%.

7. The printed circuit board of claim 1, wherein the silver metal layer is formed of a silver alloy including pure silver or a gold of 0.1 to 50%.

8. The printed circuit board of claim 1, wherein the second palladium metal layer is formed of a palladium alloy including pure palladium or at least one metal of cobalt, zinc, nickel and an inorganic substance.

9. A method of manufacturing a printed circuit board, comprising:
preparing an insulating substrate on which a circuit pattern or a base pattern is formed;
forming a nickel metal layer on the circuit pattern or the base pattern using a nickel plating solution;
forming a first palladium metal layer on the nickel metal layer using a palladium plating solution including palladium;
forming a silver metal layer on the first palladium metal layer using a silver plating solution including silver; and
forming a second palladium metal layer on the silver metal layer using the palladium plating solution including palladium.

10. The method of claim 9, wherein the forming of the nickel metal layer comprises forming the nickel metal layer which satisfies a hardness of 100 to 400 Hv.

11. The method of claim 9, wherein the manufacturing of the printed circuit board is performed by:
forming the nickel metal layer in a thickness of 0.1 to 15 μm;
forming the first palladium metal layer in a thickness of 0.01 to 0.1 μm;
forming the silver metal layer in a thickness of 0.1 to 5 μm; and
forming the second palladium metal layer in a thickness of 0.01 to 0.1 μm.

12. The method of claim 9, further comprising increasing roughness on at least one surface of the circuit pattern or the base pad, the nickel metal layer, the first palladium metal layer, the silver metal layer, and the second palladium metal layer.

13. The method of claim 9, wherein the forming of the nickel metal layer, the first palladium metal layer, the silver metal layer, and the second palladium metal layer is performed by forming the whole metal layers composed of the nickel metal layer, the first palladium metal layer, the silver metal layer, and the second palladium metal layer so as to satisfy a hardness of 80 to 500 Hv.

14. The method of claim 9, wherein the forming of the nickel metal layer, the first palladium metal layer, the silver metal layer, and the second palladium metal layer is performed by forming at least one of the nickel metal layer, the first palladium metal layer, the silver metal layer, and the second palladium metal layer using an electrolytic plating method.

15. The method of claim 9, wherein the forming of the nickel metal layer, the first palladium metal layer, the silver metal layer, and the second palladium metal layer is performed by forming at least one of the nickel metal layer, the first palladium metal layer, the silver metal layer, and the second palladium metal layer using an electroless plating method.

16. The method of claim 9, wherein the forming of the first palladium metal layer is performed by forming the first palladium metal layer using a palladium plating solution composed of pure palladium or a palladium alloy plating solution including a nickel of 15 to 25%.

17. The method of claim 9, wherein the forming of the silver metal layer is performed by forming the silver metal layer using a silver plating solution composed of pure silver or a silver alloy plating solution including a gold of 0.1 to 50%.

18. The method of claim 9, wherein the forming of the second palladium metal layer is performed by forming the second palladium metal layer using a palladium plating solution composed of pure palladium or a palladium alloy plating solution including at least one metal of cobalt, zinc, nickel and an inorganic substance.

* * * * *